United States Patent
Wu et al.

(10) Patent No.: US 8,932,802 B2
(45) Date of Patent: Jan. 13, 2015

(54) ATOMIC LAYER DEPOSITION LITHOGRAPHY

(71) Applicant: Applied Materials, Inc., Santa Clara, CA (US)

(72) Inventors: Banqiu Wu, Sunnyvale, CA (US); Ajay Kumar, Cupertino, CA (US); Omkaram Nalamasu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/762,446

(22) Filed: Feb. 8, 2013

(65) Prior Publication Data

US 2013/0224665 A1   Aug. 29, 2013

Related U.S. Application Data

(60) Provisional application No. 61/601,511, filed on Feb. 21, 2012.

(51) Int. Cl.
   *G03F 7/26*   (2006.01)
   *G03F 7/16*   (2006.01)

(52) U.S. Cl.
   CPC .......... *G03F 7/16* (2013.01)
   USPC .......................... 430/322; 430/311

(58) Field of Classification Search
   CPC ........ B82Y 10/00; B82Y 30/00; B82Y 40/00; H01L 21/28273; H01L 21/28008; H01L 21/31144; H01L 21/31116; H01L 21/31138; H01L 21/76825; G03F 7/168; G03F 7/095; G03F 7/00; Y10S 977/89; Y10S 977/891; B81B 2201/0214
   USPC ................................... 430/324; 438/487
   See application file for complete search history.

(56) References Cited

U.S. PATENT DOCUMENTS

| | | | |
|---|---|---|---|
| 7,601,652 B2 | 10/2009 | Singh et al. | |
| 2008/0283830 A1* | 11/2008 | Ahn et al. | 257/43 |
| 2010/0227458 A1* | 9/2010 | Chung et al. | 438/487 |
| 2011/0120542 A1 | 5/2011 | Levy | |

FOREIGN PATENT DOCUMENTS

| | | |
|---|---|---|
| JP | 06-120156 | 4/1994 |
| JP | 06-208965 | 7/1994 |
| JP | 10-026820 | 1/1998 |
| KR | 2010-0100186 A | 9/2010 |

OTHER PUBLICATIONS

International Search Report and Written Opinion for PCT/US2013/022988 dated May 15, 2013.

* cited by examiner

*Primary Examiner* — Caleen Sullivan
(74) *Attorney, Agent, or Firm* — Patterson & Sheridan, LLP

(57) ABSTRACT

Methods and apparatus for performing an atomic layer deposition lithography process are provided in the present disclosure. In one embodiment, a method for forming features on a material layer in a device includes pulsing a first reactant gas mixture to a surface of a substrate disposed in a processing chamber to form a first monolayer of a material layer on the substrate surface, directing an energetic radiation to treat a first region of the first monolayer, and pulsing a second reactant gas mixture to the substrate surface to selectively form a second monolayer on a second region of the first monolayer.

16 Claims, 3 Drawing Sheets

ATOMIC LAYER DEPOSITION LITHOGRAPHY

RELATED APPLICATIONS

This application claims priority to U.S. Patent Application Ser. No. 61/601,511, filed on Feb. 21, 2012, which is incorporated by reference in its entirety.

BACKGROUND

1. Field

The present invention generally relates to methods and an apparatus for an atomic layer deposition lithography process, more specifically, to methods and an apparatus for utilizing an atomic layer deposition process along with a lithography process to form features/structures on a substrate surface in the semiconductor field.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. to sub-micron dimensions), more elements are required to be put in a given area of a semiconductor integrated circuit. Accordingly, the lithography process has become more and more challenging to transfer even smaller features onto a substrate precisely and accurately without damage. In order to transfer precise and accurate features onto a substrate, a desired high resolution lithography process requires having a suitable light source that may provide a radiation at a desired wavelength range for exposure. Furthermore, the lithography process requires transferring features onto a photoresist layer with minimum structure and/or critical dimension alternation. Recently, an extreme ultraviolet (EUV) radiation source has been utilized to provide short exposure wavelengths so as to further reduce the minimum size printable on a substrate. However, at such small dimensions, the collapse or damage of the photoresist layer often occurs during the subsequent etching process, resulting in failure to successfully transfer structures onto a substrate surface.

In a conventional lithography process, some portions of a photoresist layer disposed on a substrate are exposed to incident radiation to undergo a chemical transformation. In a traditional positive tone exposure process, the exposed portion of the photoresist layer experiencing the chemical transformation is removed during the development process with an aqueous base solution. As the feature sizes formed on microelectronic device continue to shrink, the aqueous base solution developer may become problematic due to image collapse caused by the capillary forces and surface tension of water. Furthermore, solution based developers tend to leave undesired contaminates on the substrate after the development process, thereby adversely effecting the substrate cleanliness.

Therefore, there is a need for a method and an apparatus to control process defects for a lithography process with minimum structure damage so as to obtain a precise structure transfer onto a substrate surface with desired critical dimensions.

SUMMARY

Methods and an apparatus for performing an atomic layer deposition lithography process are provided in the present disclosure. In one embodiment, a method for forming features on a material layer in a device includes pulsing a first reactant gas mixture to a surface of a substrate disposed in a processing chamber to form a first monolayer of a material layer on the substrate surface, directing an energetic radiation to treat a first region of the first monolayer, and pulsing a second reactant gas mixture to the substrate surface to selectively form a second monolayer on a second region of the first monolayer.

In another embodiment, a method for forming features on a material layer in a device includes directing a light radiation to treat a first region of a first monolayer of a material layer deposited by a pulse of a first reactant gas mixture performed in an atomic layer deposition process, continuing performing the atomic layer deposition process to form a second monolayer on the first monolayer of the material layer, and removing the first monolayer in the first region treated by the light radiation.

In yet another embodiment, a processing chamber configured to perform an atomic deposition layer process and a lithography process includes a chamber body having a chamber lid disposed on the chamber body defining an interior processing region therein, a pedestal disposed in the interior processing region, a gas delivery system disposed on the chamber body to deliver a reactant gas into the interior processing region, an energy beam source disposed under the chamber lid to direct an energetic radiation toward the interior processing region, and a mask disposed between the energy beam source and the pedestal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

Methods and an apparatus for performing an atomic layer deposition (ALD) lithography process are provided in the present disclosure. The ALD lithography process utilizes an ALD process along with a lithography process to form features onto a substrate surface without using a conventional photoresist layer and/or a hardmask layer. The ALD lithography processing chamber provides a dual function; to deposit an atomic layer deposited layer and to perform a lithography process (e.g., energy beam treatment process) to form features/structures on the atomic layer deposited layer. The substrate may include one or more nonconductive materials, such as silicon, silicon oxide, doped silicon, germanium, gallium arsenide, glass, and sapphire. The substrate may also include dielectric materials such as silicon dioxide, organosilicates, and carbon doped silicon oxides. Further, the substrate can include any other materials such as metal nitrides and metal alloys, depending on the application. In one or more embodiments, the substrate may form a gate structure including a gate dielectric layer and a gate electrode layer to facilitate connection with an interconnect feature, such as a plug, via, contact, line, and wire, subsequently formed thereon. The substrate may be used for integrated circuit, solar, MEMs or other device fabrication.

Moreover, the substrate is not limited to any particular size or shape. The substrate may be a round substrate having a 200 mm diameter, a 300 mm diameter or other diameters, such as 450 mm, among others. The substrate may also be any polygonal, square, rectangular, curved or otherwise non-circular workpiece, such as a polygonal glass substrate used in the fabrication of flat panel displays.

The present invention provides methods for depositing/forming a material layer on a substrate by an ALD process followed by a lithography process (e.g., energy beam treatment process) to form features/structures on the deposited material layer. The process may efficiently forms features/structures with desired small critical dimension onto a substrate surface without using a conventional photoresist layer and/or hardmask layer to assist transferring features/structures onto the substrate surface, thereby improving manufacture cycle time and cost and also reducing manufacture complexity. Advantageously, both the ALD and the lithography process may be performed in a single chamber.

Figure 1:
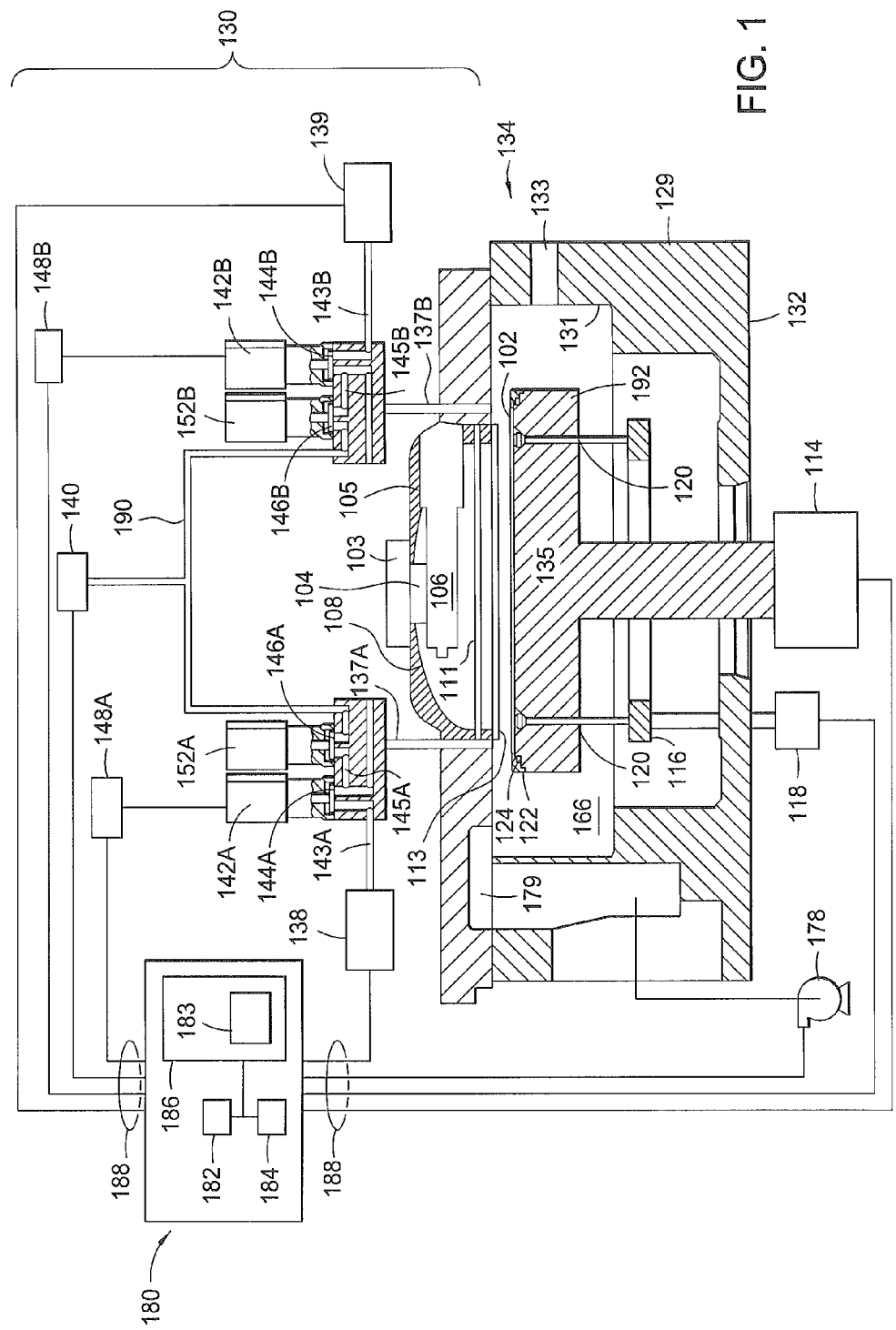
FIG. 1 depicts a sectional view of one embodiment of an atomic layer deposition (ALD) lithography processing chamber suitable for performing one embodiment of the present invention.

FIG. 1 is a schematic cross-sectional view of one embodiment of an ALD lithography processing chamber 134. The ALD lithography processing chamber 134 includes a gas delivery apparatus 130 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 134 may also be adapted for other deposition techniques along with lithography process.

The chamber 134 comprises a chamber body 129 having sidewalls 131 and a bottom 132. A slit valve tunnel 133 formed through the chamber body 129 provides access for a robot (not shown) to deliver and retrieve a substrate 102, such as a 200 mm, 300 mm or 450 mm semiconductor substrate or a glass substrate, from the chamber 134.

A substrate support 192 is disposed in the chamber 134 and supports the substrate 102 during processing. The substrate support 192 is mounted to a lift 114 to raise and lower the substrate support 192 and the substrate 102 disposed thereon. A lift plate 116 is connected to a lift plate actuator 118 that controls the elevation of the lift plate 116. The lift plate 116 may be raised and lowered to raise and lower pins 120 movably disposed through the substrate support 192. The pins 120 are utilized to raise and lower the substrate 102 over the surface of the substrate support 192. The substrate support 192 may include a vacuum chuck, an electrostatic chuck, or a clamp ring for securing the substrate 102 to the surface of the substrate support 192 during processing.

The substrate support 192 may be heated to heat the substrate 102 disposed thereon. For example, the substrate support 192 may be heated using an embedded heating element, such as a resistive heater, or may be heated using radiant heat, such as heating lamps disposed above the substrate support 192. A purge ring 122 may be disposed on the substrate support 192 to define a purge channel 124 which provides a purge gas to a peripheral portion of the substrate 102 to prevent deposition thereon.

A gas delivery apparatus 130 is disposed at an upper portion of the chamber body 129 to provide a gas, such as a process gas and/or a purge gas, to the chamber 134. A pumping system 178 is in communication with a pumping channel 179 to evacuate any desired gases from the chamber 134 and to help maintain a desired pressure or a desired pressure range inside a pumping zone 166 of the chamber 134.

In one embodiment, the gas delivery apparatus 130 includes an expanding channel 190 having gas inlets 137A, 137B to provide gas flows from two similar valves 142A, 142B. The gas flows from the valves 142A, 142B may be provided together and/or separately.

In one configuration, valve 142A and valve 142B are coupled to separate reactant gas sources but are coupled to the same purge gas source. For example, valve 142A is coupled to a reactant gas source 138 and valve 142B is coupled to reactant gas source 139, and both valves 142A, 142B are coupled to purge a gas source 140. Each valve 142A, 142B includes a delivery line 143A, 143B having a valve seat assembly 144A, 144B and includes a purge line 145A, 145B having a valve seat assembly 146A, 146B. The delivery line 143A, 143B is in communication with the reactant gas source 138, 139 and is in communication with the gas inlet 137A, 137B of the expanding channel 190. The valve seat assembly 144A, 144B of the delivery line 143A, 143B controls the flow of the reactant gas from the reactant gas source 138, 139 to the expanding channel 190. The purge line 145A, 145B is in communication with the purge gas source 140 and intersects the delivery line 143A, 143B downstream of the valve seat assembly 144A, 144B of the delivery line 143A, 143B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 138, 139, the same gas is used as a carrier gas and a purge gas (i.e., an argon gas used as a carrier gas and a purge gas).

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned as slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume.) Each valve 142A, 142B may be adapted to provide a combined gas flow and/or separate gas flow of the reactant gas 138, 139 and the purge gas 140. The pulses of the purge gas may be provided by opening and closing a diaphragm of the valve seat assembly 146A of the purge line 145A. The pulses of the reactant gas from the reactant gas source 138 may be provided by opening and closing the diaphragm valve seat 144A of the delivery line 143A.

A power source 103 is coupled to a lid 105 disposed on the chamber body 129. The power source 103 is configured to provide power to an energy beam source 106 disposed under the power source 103 connected through an aperture 104 formed therebetween. In one embodiment, the energy beam source 106 may be any suitable energetic radiation source that may provide UV light or other energetic radiation, such as mercury microwave arc lamps, pulsed xenon flash lamps, high efficiency UV light emitting diode arrays, and electron beam generators. The UV lamp bulbs may be sealed plasma bulbs filled with one or more gases, such as xenon (Xe) or mercury (Hg) for excitation by the power source 103. Light emitted from the energy beam source 106 enters the substrate surface by passing through a window 111 disposed below the energy beam source 106. The window 111 may be made of a quartz glass having sufficient thickness to maintain vacuum without cracking. A photomask and/or a feature transfer shield 113 is disposed between the substrate 102 and the window 111. The position of the feature transfer shield 113 can be adjusted between the window 111 and the surface of the substrate 102 so as to assist in transferring features/structures onto the substrate 102 surface. The photomask/the feature transfer shield 113 disposed in the processing chamber 134 may assist by allowing only a portion of the light from the energy beam source 106 to pass therethrough to certain regions of the substrate 102, protecting some other regions from being exposed to light when the energy beam source 106 is turned on. The energy beam source 106 along with the photomask/feature transfer shield 113 serve as a features/structures transferring mechanism configured to perform a lithography process to transfer features/structures onto a material layer disposed on the substrate surface without breaking vacuum during and/or after a deposition process.

In one embodiment, the photomask/the feature transfer shield 113 may provide features/structures formed therein with a dimension less than 180 nm so as to transfer similar features/structures onto the substrate surface with or without image reduction. Details regarding how the lithography process may be performed utilizing the energy beam source 106 along with the photomask/feature transfer shield 113 will be further discussed below with reference to FIGS. 2-3E.

In FIG. 1, a control unit 180 may be coupled to the chamber 134 to control processing conditions. The control unit 180 comprises a central processing unit (CPU) 182, support circuitry 184, and memory 186 containing associated control software 183. The control unit 180 may be one of any form of general purpose computer processors that can be used in an industrial setting for controlling various chambers and subprocessors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 134. The control unit 180 may be coupled to another controller that is located adjacent individual chamber components, such as the programmable logic controllers 148A, 148B of the valves 142A, 142B. Bi-directional communications between the control unit 180 and various other components of the chamber 134 are handled through numerous signal cables collectively referred to as signal buses 188, some of which are illustrated in FIG. 1. In addition to the control of process gases and purge gases from gas sources 138, 139, 140 and from the programmable logic controllers 148A, 148B of the valves 142A, 142B, the control unit 180 may be configured to be responsible for automated control of other activities used in substrate processing, such as substrate transport, temperature control, chamber evacuation, among other activities, some of which are described elsewhere herein.

Figure 2:
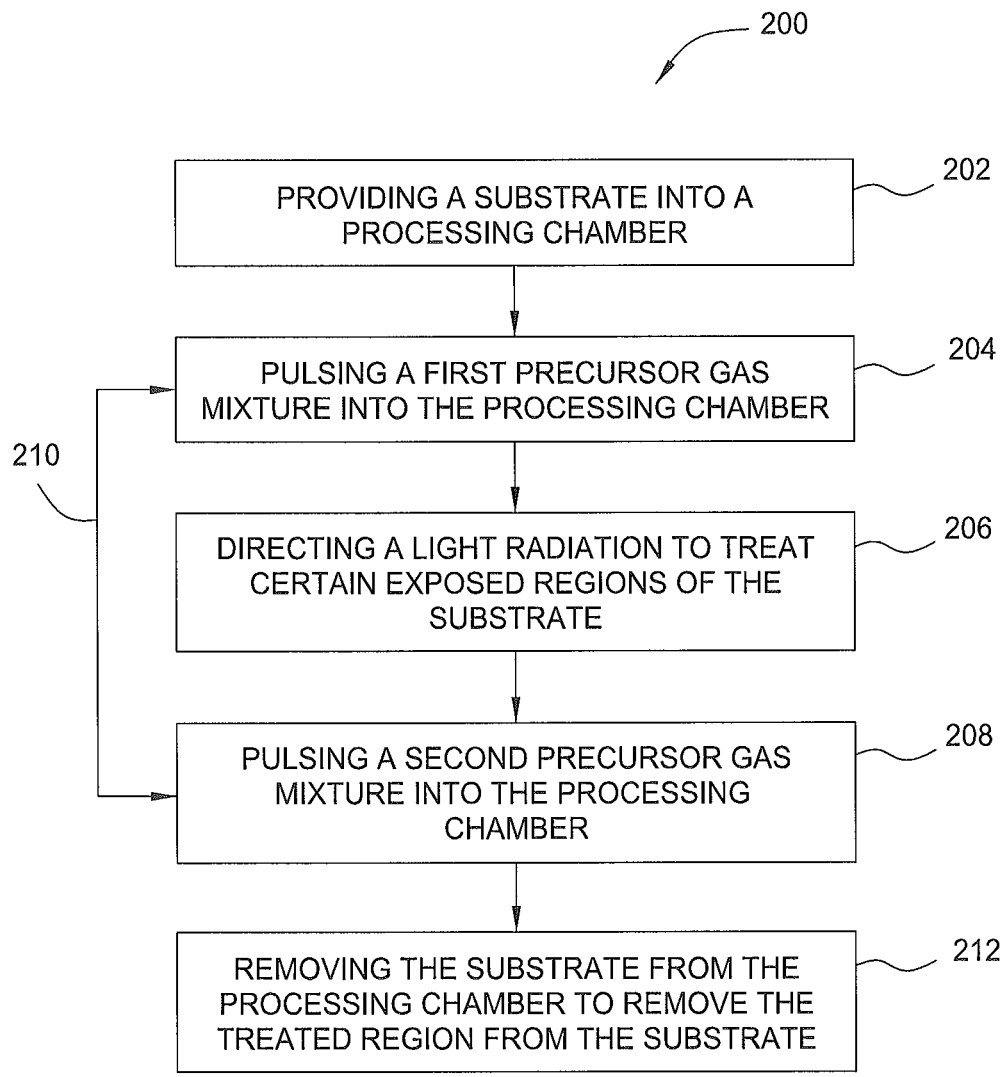
FIG. 2 depicts a flow diagram for performing an ALD lithography process which may be performed using the ALD lithography processing chamber depicted in FIG. 1.

FIG. 2 illustrates a flow diagram of one embodiment of a process 200 used to perform an ALD lithography process to form a patterned atomic layer deposited material layer in a semiconductor device structure on a substrate. The process 200 described in FIG. 2 corresponds to the fabrication stages depicted in FIGS. 3A-3E, which are discussed below. FIGS. 3A-3E illustrate schematic cross-sectional views of a substrate, such as the substrate 102 depicted in FIG. 1, configured to form an atomic layer deposited material layer with desired structures/features thereon during different stages illustrated by the process 200.

Figure 3A:
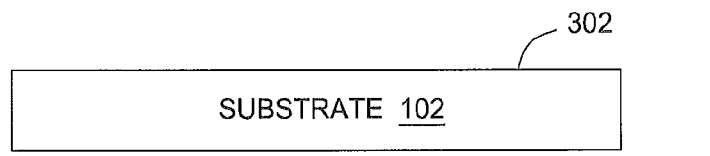
FIGS. 3A-3E depict cross-sectional views of a semiconductor device during the different stages of performing an ALD lithography process in accordance with one embodiment of the present invention.

The process 200 starts at block 202 by providing a substrate, such as the substrate 102 depicted in FIG. 3A, into the processing chamber, such as the substrate 102 disposed in the processing chamber 134 depicted in FIG. 1, or other suitable processing chambers. The substrate 102 shown in FIG. 3A may comprise a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 102 may have various dimensions, such as 200 mm, 300 mm or 450 mm diameter or other dimensions, as well as, rectangular or square panels. Unless otherwise noted, embodiments and examples described herein may be conducted on substrates with a 200 mm diameter, a 300 mm diameter, or a 450 mm diameter, for example, a 300 mm diameter.

The substrate 102 has a first surface 302 exposed upward facing the energy beam source 106 and the gas inlets 137A, 137B readily to have the ALD lithography process to be performed thereon.

Figure 3B:
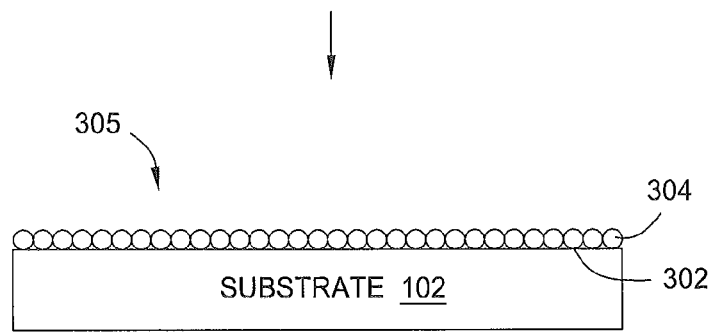

At block 204, after the substrate 102 is transferred into the processing chamber 134, a pulse of a first reactant gas mixture is supplied into the processing chamber 134 to form a first monolayer 304 of a material layer 305 on the surface 302 of the substrate 102, as shown in FIG. 3B. During the pulsing of the first reactant gas mixture, the first reactant gas mixture may be supplied simultaneously with, sequentially with, or alternatively without a reducing gas mixture ("reagent"), such as a hydrogen gas ($H_2$) or a $NH_3$ gas, into the processing chamber 134 during a thermal ALD process or a plasma ALD process as needed. A suitable first reactant gas mixture that may be supplied into the processing chamber 134 may include a silicon containing gas, such as $SiH_4$, $Si_2H_6$, or other suitable silicon containing compounds, tantalum containing gas, titanium containing gas, cobalt containing gas, tungsten containing gas, aluminum containing gas, nickel containing gas, copper containing gas, boron containing gas, phosphorus containing gas, nitrogen containing gas, or other suitable gases that may deposit a monolayer on the substrate surface suitable for using in semiconductor devices. Examples of the alternative reagents (i.e., reducing agents used with reactant precursors for forming the monolayer during the deposition process) as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

During the pulse of the first reactant gas mixture at block 204, the pulse of the first reactant gas mixture lasts for a predetermined time interval. The term pulse as used herein refers to a dose of material injected into the process chamber. Between each pulse of the first reactant gas mixture or of the first and a second reactant gas mixture, which will be discussed further below, the purge gas mixture may be pulsed into the processing chamber in between each or multiple pulses of the first and/or second reactant precursor gas mixture to remove the impurities or residual precursor gas mixture which is unreacted/non-absorbed by the substrate surface (e.g., unreacted impurities from the reactant gas mixture or others) so they can be pumped out of the processing chamber.

In operation at block 204, a pulse of the first reactant gas mixture is pulsed into the processing chamber 134 to form a first monolayer 304 of the material layer 305. Each pulse of the first reactant precursor gas mixture pulsed into the processing chamber 134 may deposit the first monolayer 304 of the material layer 305 having a thickness between about 3 Å and about 5 Å.

During pulsing of the first reactant precursor gas mixture, several process parameters are also regulated. In one embodiment, the process pressure is controlled at between about 7 Torr and about 30 Torr. The processing temperature is between about 125 degrees Celsius and about 450 degrees Celsius. The RF power may be controlled at between about 100 watts and about 2000 watts. The reactant gas supplied in the first reactant gas mixture may be controlled at between about 5 sccm and about 10 sccm. The reducing gas, such as the $NH_3$ gas, may be supplied at between about 100 sccm and about 700 sccm.

Figure 3C:
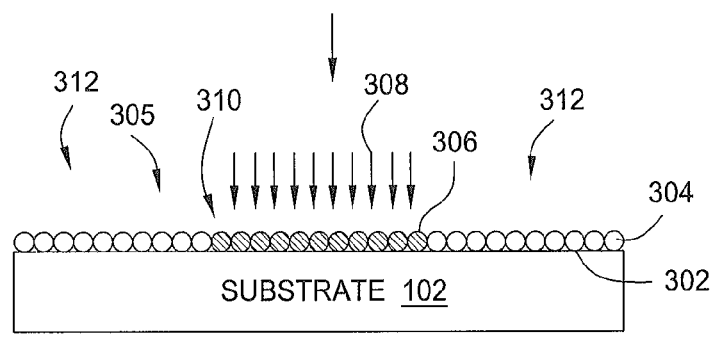

At block 206, a light beam 308 is directed from the energy source 106 to the first monolayer 304 of the material layer 305 to treat a first region 310 of the first monolayer 304, as shown in FIG. 3C. The material layer 305 located in the first region 310 is then treated to form a treated layer 306 of the material layer 305. The light beam 308 from the energy source 106 transmitted through the photomask/feature transfer shield 113 travels only to the first region 310 of the material layer 305 unprotected by the photomask/feature transfer shield 113. The light passed through the photomask/feature transfer shield 113 only treats the first region 310 of the material layer 305 without treating the protected region 312 of the material layer 305. The material layer 305 located in the first region 310 undergoes chemical transformation after the light treatment and is converted into the treated layer 306, an etchant-removable material. This treated material 306 may then be later removed by a process containing the proper etchant to be chemically removed from the substrate surface 302. It is also contemplated that the material layer 305 may alternatively be etch treatable, and that energy treatment transforms the treated layer 306 into an etch-resistant layer for negative-tone patterning.

In one embodiment, the light beam 308 directed from the energy beam source 106 may be an extreme UV light, deep UV light, electron beam, x-ray, ion beam, or other suitable beams. In one example, the light beam 308 directed from the energy beam source 106 may be a UV light having a wavelength between about 5 nm and about 400 nm.

It is believed that the light energy directed to form the treated layer 306 may damage, cure, modify or alter the chemical bonding or atomic structure of the material layer 305, thereby forming the treated layer 306 having film properties different from the untreated material layer 305 on the substrate surface 302. By doing so, a selective film alternation process may be obtained to only selectively alter the film properties of a portion of the material layer 305 and keep another portion of the material layer 305 remains unchanged. Thus, a selective etching/film removal process may be later performed to only selectively remove a portion (i.e., the treated or untreated depending on the process) of the material layer from the substrate surface 302 as needed.

Figure 3D:
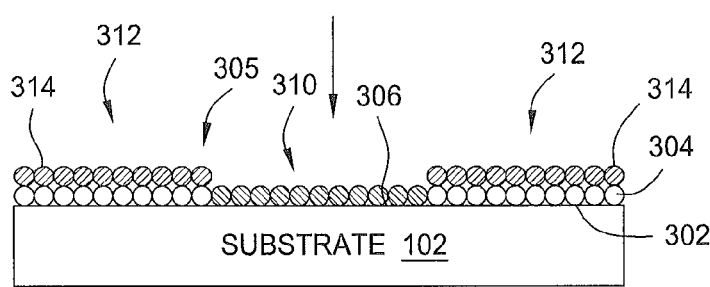

At block 208, after the light treatment process performed on the first region 310 of the material layer 305, a pulse of a second reactant gas mixture is supplied into the processing chamber 134 to form a second monolayer 314 of the material layer 305 on the surface 302 of the substrate 102, as shown in FIG. 3D. During the pulsing of the second reactant gas mixture, the second reactant gas mixture may be supplied simultaneously with, sequentially with, or alternatively without a reducing gas mixture (or called reagent), such as a hydrogen gas ($H_2$) or a $NH_3$ gas, into the processing chamber 134 during a thermal ALD process or a plasma ALD process as needed. It is believed that the second monolayer 314 is absorbed onto the first monolayer 304 by a chemical reaction to allow the atoms from the second monolayer 314 to be securely adhered on the atoms from the first monolayer 304. Since the treated layer 306 undergone the light treatment process may have chemical properties different from the untreated first monolayer 304, the atoms in the treated layer 306 may not be able to successfully adhere the atoms from the second monolayer 314, thereby only allowing the atoms from the second monolayer 314 to be adhered on the atoms of the first untreated monolayer 304. In this way, the subsequently formed second monolayer 314 only selectively deposits on the untreated first monolayer 304, thereby assisting the later performed removal process to selectively remove only the treated first monolayer 304 from the substrate surface without attacking the second monolayer 314, which will be further discussed below with reference to FIG. 3E at block 212. In the alternative negative tone process, the second monolayer 314 is disposed over the treated layer 306, and the untreated portions of the first monolayer 304 are removed.

In one embodiment, a suitable second reactant gas mixture that may be supplied into the processing chamber 134 may include a silicon containing gas, such as $SiH_4$, $Si_2H_6$, or other suitable silicon containing compounds, oxygen containing gas, such as $H_2O$, $O_2$, or $O_3$, tantalum containing gas, titanium containing gas, cobalt containing gas, tungsten containing gas, aluminum containing gas, nickel containing gas, copper containing gas, boron containing gas, phosphorus containing gas, nitrogen containing gas, or other suitable gases that may deposit a monolayer on the substrate surface suitable for using in semiconductor devices. Examples of the alternative reagents (i.e., reducing agents used with reactant precursors for forming the monolayer during the deposition process) as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{18}$), methyl silane ($SiCH_6$), dimethylsilane ($SiC_2H_8$), phosphine ($PH_3$), derivatives thereof, plasmas thereof, or combinations thereof.

During the pulse of the second reactant gas mixture at block 208, the pulse of the second reactant gas mixture lasts for a predetermined time interval. The term pulse as used herein refers to a dose of material injected into the process chamber. Between each pulse of the second reactant gas mixture or of the first and the second reactant gas mixture performed at blocks 204 and 206, the purge gas mixture may be pulsed into the processing chamber in between each or after multiple pulses of the first and/or second reactant precursor gas mixture to remove the impurities or residual precursor gas mixture which is unreacted/non-absorbed by the substrate surface (e.g., unreacted impurities from the reactant gas mixture or others) so they can be pumped out of the processing chamber.

In operation at block 208, a pulse of the second reactant gas mixture is pulsed into the processing chamber 134 to selectively form the second monolayer 314 on the first monolayer 304 untreated in the protected region 312. Each pulse of the second reactant precursor gas mixture pulsed into the processing chamber 134 may deposit the second monolayer 314 of the material layer 305 having a thickness between about 3 Å and about 5 Å.

During pulsing of the second reactant precursor gas mixture, several process parameters are also regulated. In one embodiment, the process pressure is controlled at between about 5 Torr and about 30 Torr. The processing temperature is between about 125 degrees Celsius and about 450 degrees Celsius. The RF power may be controlled at between about 100 watts and about 800 watts. The reactant gas supplied in the second reactant gas mixture may be controlled at between about 5 sccm and about 20 sccm. The reducing gas, such as the $NH_3$ gas, may be supplied at between about 100 sccm and about 700 sccm.

In between each or after several pulses of reactant precursor gas mixtures, a purge gas mixture is then supplied into the processing chamber 134 to purge out the residuals and impurities from the processing chamber. Several process parameters are also regulated during pulsing of the purge gas mixture. In one embodiment, the process pressure is controlled at between about 1 Torr and about 100 Torr. The processing temperature is between about 125 degrees Celsius and about 450 degrees Celsius. The RF power may be controlled at between about 100 watts and about 800 watts. The Ar or $N_2$ gas may be supplied at between about 200 sccm and about 1000 sccm.

Subsequent to the pulse of the purge gas mixture, additional cycles starting from the pulsing of the first and/or second reactant gas mixtures followed by the pulse of the purge gas mixture can then be repeatedly performed until a desired thickness range of the material layer 305 is reached, as indicated by loop 210 depicted in FIG. 2. When a subsequent cycle of pulsing the first reactant gas mixture at block 204 starts, the process pressure and other process parameters may be regulated to the predetermined level to assist depositing a subsequent monolayer of the material layer 305.

It is noted that the blocks 204, 206, and 208 may be performed in different chambers providing different functions as needed. For example, at block 204, the deposition process for forming a first monolayer may be performed in a first deposition chamber. Subsequently, at block 206, the substrate may then be transferred to a second chamber having the light source with desired wavelength range to perform the light exposure process. Afterwards, at block 208, the substrate can then be transferred back to the first chamber to finish depositing the second monolayer on the first monolayer. Alternatively, at block 208, the substrate may be transferred to a third processing chamber to finish forming the second monolayer on the substrate as needed. It is noted that the first, the second and/or the third processing chamber may all be incorporated in a cluster tool and the substrate may be transferred among the first, the second and/or the third processing chamber (or back to the first processing chamber) without breaking vacuum and exposing the substrate to atmosphere.

Figure 3E:
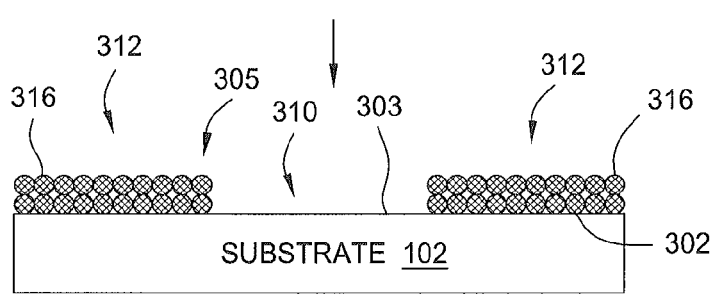

At block 212, after the material layer 305 reaches a predetermined thickness, the substrate 102 may be removed from the processing chamber 134 to perform a removal process to remove the treated layer 306 from the substrate surface 302, as shown in FIG. 3E. It is noted that after the second monolayer 314 is formed on the first monolayer 304, the atoms from the second monolayer 314 will then react with the atoms from the first monolayer 304 to form a compound material 316 including the atoms both from the first monolayer 304 and the second monolayer 314.

In one embodiment, the removal process may be any suitable etching/development process configured to remove the treated layer 306 from the substrate 102. Suitable examples of the removal process include a dry etching process, a wet etching process, a development process, an ashing process, or other suitable film removal processes. Any conventional suitable etching process that is available to remove the treated layer 306 may be utilized. After the removal process is completed, the treated layer 306 remained on the substrate 302 is removed exposing the underlying surface 303 of the substrate 102 in the exposed region 310.

In one embodiment, the removal process may be performed by a dry etching process providing a halogen containing gas to remove the treated layer 306 from the substrate 102. Suitable examples of the halogen containing gas include chlorine gas ($Cl_2$), nitrogen trifluoride ($NF_3$), sulfur hexafluoride gas ($SF_6$), carbon and fluorine containing gas, such as $CF_4$, $CHF_3$, or $C_4F_8$, chlorine gas ($Cl_2$), boron chloride ($BCl_3$), and hydrogen chloride (HCl), among others. In some embodiment, some reducing agents may be supplied with the halogen containing gas to perform the removal process. Suitable reducing agents include, but are not limited to, hydrocarbon gases, such as carbon monoxide (CO), oxygen gas ($O_2$), methane ($CH_4$), ethane ($C_2H_6$), ethylene ($C_2H_4$), and combinations thereof, among others.

After the removal process is performed and completed on the substrate 102, a material layer with desired features formed thereon may be obtained. By doing so, a conventional lithography process along with a development process utilizing a photoresist layer and/or hardmask layer is eliminated since the features/structures can now be directly transferred onto the material layers without using additional photoresist layer and/or hardmask layer. Therefore, manufacture complexity, cost and cycle time are then efficiently reduced and improved.

Thus, methods and apparatus for performing an ALD lithography process are provided in the present disclosure. The ALD lithography process utilizes an ALD process along with a lithography process to form features on a substrate surface without using conventional masks formed from a photoresist layer and/or a hardmask layer. The ALD lithography process as described herein efficiently reduces manufacturing complexity, cost and cycle time and improves manufacturing flexibility and productivity.

While the foregoing is directed to embodiments of the present invention, other and further embodiments of the invention may be devised without departing from the basic scope thereof, and the scope thereof is determined by the claims that follow.

The invention claimed is:

1. A method for forming features on a compound layer in a device, comprising:
   (a) pulsing a first reactant gas mixture to a surface of a substrate disposed in a processing chamber to form a first monolayer of a compound layer on the substrate surface;
   (b) directing an energetic radiation to treat a first region of the first monolayer;
   (c) removing the first monolayer from the first region; and
   (d) pulsing a second reactant gas mixture to the substrate surface to selectively form a second monolayer on a second region of the first monolayer, wherein the second monolayer reacts with the first monolayer to form a compound layer on the second region.

2. The method of claim 1, further comprising:
selectively removing the first monolayer disposed in the first region thereof treated by the energetic radiation.

3. The method of claim 2, further comprising:
forming structures or features in the first and the second monolayer after removing the treated first monolayer on the substrate surface.

4. The method of claim 2, wherein removing the first monolayer comprises:
performing an etching process to remove the treated first monolayer from the substrate surface.

5. The method of claim 1, wherein the light radiation is a UV light source having a wavelength between about 5 nm and about 400 nm.

6. The method of claim 1, wherein directing the energetic radiation further comprises:
directing the energetic radiation to the first region of the first monolayer unprotected by a mask wherein the energetic radiation passes therethrough.

7. The method of claim 1, further comprising:
pulsing a purge gas mixture to the processing chamber after the pulsing of the first reactant gas mixture or the second reactant gas mixture.

8. The method of claim 1, further comprising:
repeating (a) to (c) until a predetermined total thickness of the first and the second monolayer is reached.

9. The method of claim 1, wherein directing the energetic radiation comprises:
altering chemical properties of the first monolayer in the first region.

10. The method of claim 1, wherein (a) to (c) are performed in a single processing chamber.

11. The method of claim 1, wherein (a) and (c) of pulsing the first and the second reactant gas mixture are formed in the processing chamber and (b) is performed in another processing chamber.

12. A method for forming features on a compound layer in a device, comprising:
directing an energetic radiation to treat a first region of a first monolayer of a compound layer deposited by a pulse of a first reactant gas mixture performed in an atomic layer deposition process;
continuing to perform the atomic layer deposition process to form a second monolayer on the first monolayer of the compound layer, the second monolayer failing to adhere to the first region of the first monolayer, wherein the second monolayer reacts with the first monolayer to form a compound layer on a second region; and
removing the first monolayer in the first region treated by a light radiation.

13. The method of claim 12, wherein continuing to perform the atomic layer deposition process comprises:
selectively forming the second monolayer only on a second region of the first monolayer layer untreated by the energetic radiation.

14. The method of claim 12, wherein removing the first monolayer further comprises:
selectively removing the treated first monolayer from the substrate surface without removing the second monolayer.

15. The method of claim 12, wherein the light radiation is a UV light source having a wavelength between about 5 nm and about 400 nm.

16. A method for forming features on a compound layer in a semiconductor device, comprising:
(a) pulsing a first reactant gas mixture to a surface of a substrate disposed in a processing chamber to form a first monolayer of a compound layer on the substrate surface;
(b) directing a light radiation to treat a first region of the first monolayer;
(c) pulsing a second reactant gas mixture to selectively form a second monolayer on the first region of the first monolayer, the second monolayer failing to adhere to the second region of the first monolayer, wherein the second monolayer reacts with the first monolayer to form a compound layer on the first region; and
(d) selectively removing a second region of the first monolayer that was not treated by the light radiation.

* * * * *